United States Patent [19]

Pfleiderer et al.

[11] Patent Number: 4,539,537
[45] Date of Patent: Sep. 3, 1985

[54] TRANSVERSAL FILTER HAVING PARALLEL INPUTS

[75] Inventors: Hans-Joerg Pfleiderer, Zorneding; Karl Knauer, Kirshseon, both of Fed. Rep. of Germany

[73] Assignee: Siemens Aktiengesellschaft, Berlin & Munich, Fed. Rep. of Germany

[21] Appl. No.: 499,483

[22] Filed: May 31, 1983

[30] Foreign Application Priority Data

Sep. 27, 1982 [DE] Fed. Rep. of Germany ....... 3235744

[51] Int. Cl.$^3$ ............................................ H03H 15/02
[52] U.S. Cl. .................................... 333/165; 333/166; 377/70; 377/75
[58] Field of Search ............... 333/165, 166, 167, 174; 364/724, 726, 824, 825, 862; 377/57, 59, 60, 62, 63, 70-72, 73-75, 76-79; 328/151, 167

[56] References Cited

U.S. PATENT DOCUMENTS 4,163,957  8/1979  Knauer et al. ....................... 333/165
4,231,002 10/1980  Knauer et al. ....................... 333/165
4,249,145  2/1981  Sakaue et al. ................... 333/166 X Primary Examiner—Marvin L. Nussbaum
Attorney, Agent, or Firm—Hill, Van Santen, Steadman & Simpson

[57] ABSTRACT

A transversal filter with an analog shift register has a plurality of parallel inputs and a serial output at which a filtered signal appears. An object is to provide as simple as possible a realization of the n signal evaluators allocated to the n stages of the shift register. This is achieved by providing the n signal evaluators in a signal path proceeding from the input of the first stage over all n stages, and to evaluate according to evaluation factors $b_n$ through $b_1$ which occur in the system function $$H(z) = b_0 \cdot (1 + b_1 z(1 + b_2 \cdot z( \ldots 1 + b_n \cdot z)))$$

describing the filtered signal, where z is the delay which the signal values respectively experience when traversing a stage of the shift register. The filter is employed as an analog filter in communication technology.

7 Claims, 5 Drawing Figures

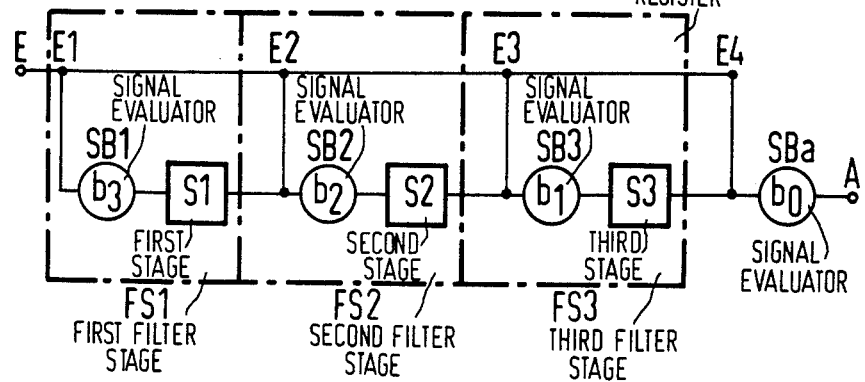
FIG 1 TRANSVERSAL FILTER AND THREE STAGE ANALOG SHIFT REGISTER
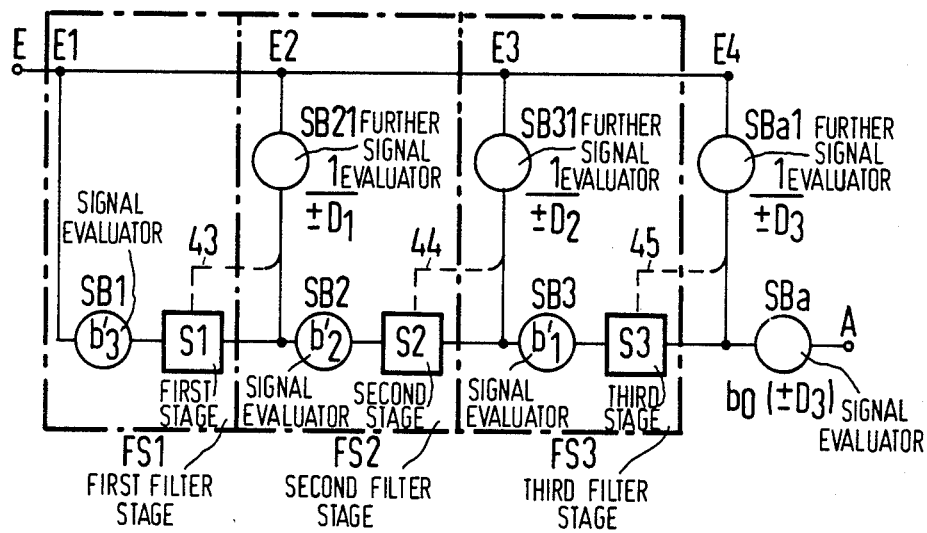
FIG 2

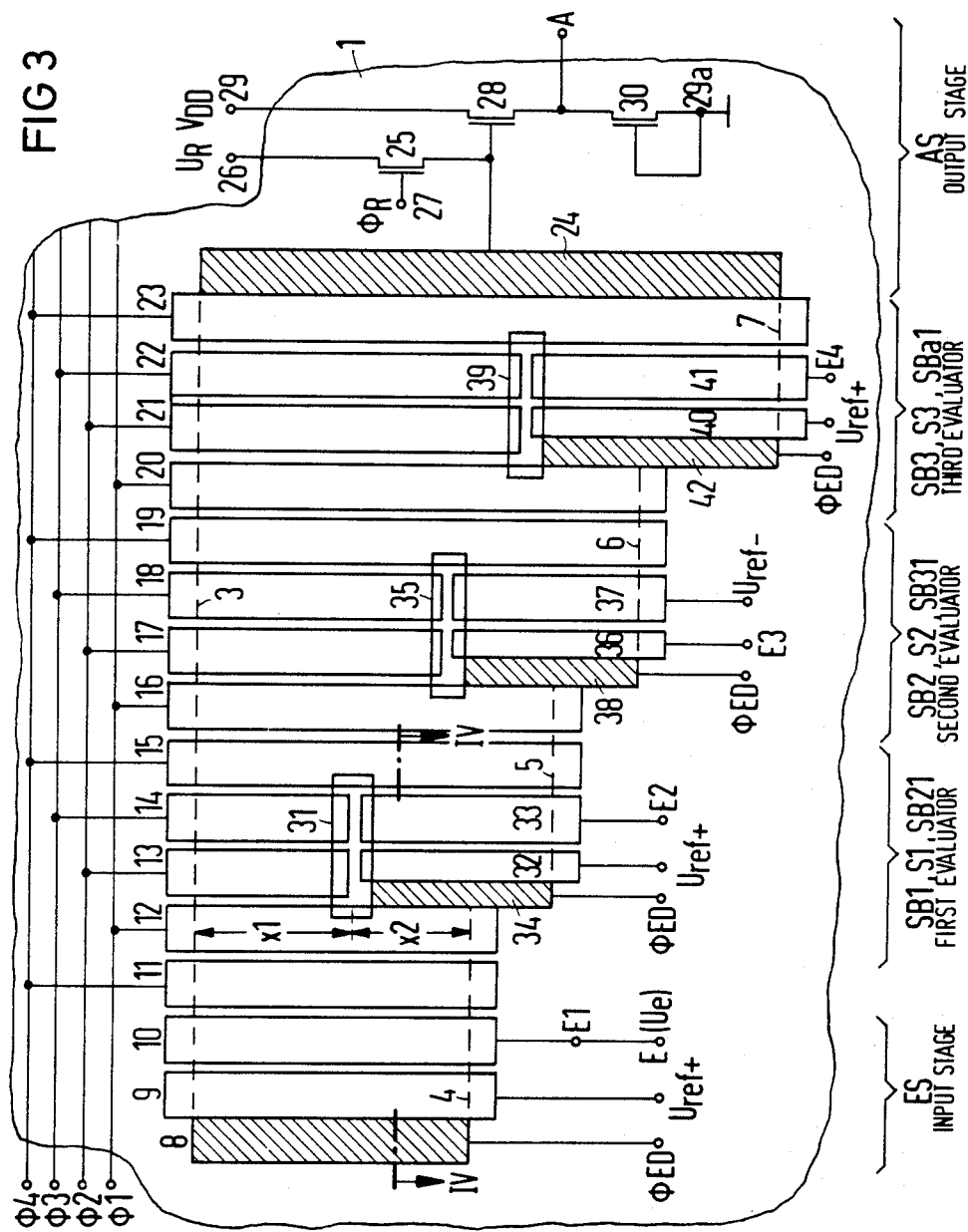

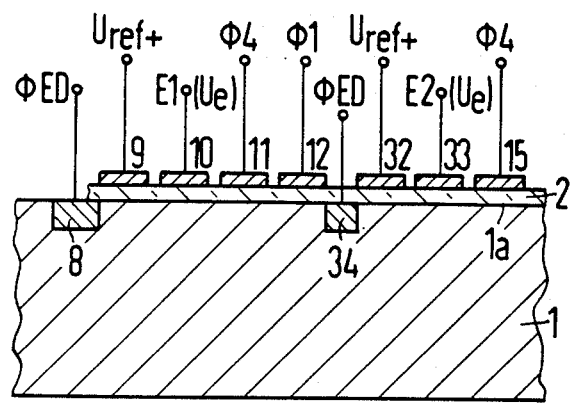
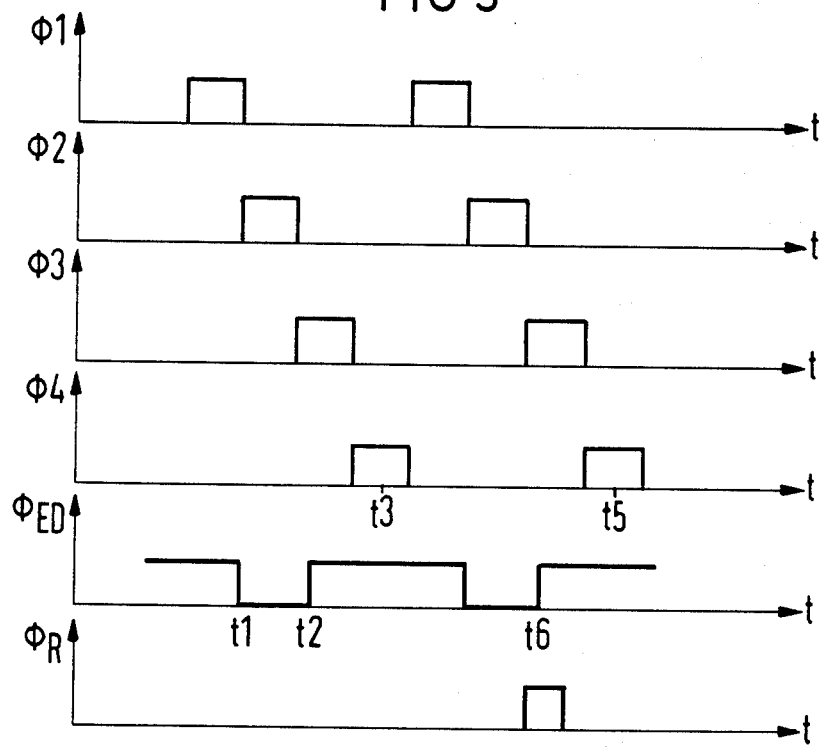

TRANSVERSAL FILTER HAVING PARALLEL INPUTS

BACKGROUND OF THE INVENTION

The invention relates to a transversal filter formed of an analog shift register having a plurality of parallel inputs and a serial output, and wherein a signal input is provided which supplies an input signal to all parallel inputs where the input signal becomes successively sampled signal values. A serial output is also provided where a filtered output signal is available. Signal evaluators and parallel inputs are respectively allocated to the stages of the shift register.

Such a transversal filter is known, for example, from U.S. Pat. No. 4,163,957, incorporated herein by reference. Allocated to the signal evaluators of the individual register stages which respectively lie in series with the parallel inputs are evaluation factors $a_o$ through $a_n$ which correspond to the filter coefficients referenced $a_o$ through $a_n$ in the relationship $$H(z) = a_o + a_1 \cdot z + a_2 \cdot z^2 + \ldots + a_n \cdot z^n \tag{1}$$

$H(z)$ represents the system function of the filtered signal and z represents the delay time which a sampled signal value experiences when traversing a stage of the shift register. It is disadvantageous, however, that the evaluation factors $a_o$ through $a_n$ can assume greatly deviating values for the realization of specific filter curves, this complicating a realization of the filter circuit.

SUMMARY OF THE INVENTION

An object of the invention is to specify a transversal filter of the type initially cited which is more simply constructed in terms of the signal evaluators and which can be more precisely matched to the desired filter curve than is the case given the traditional filters. With the invention, each of n signal evaluator means are positioned in a signal path between the parallel input of the first stage and through all stages. The signal evaluator means of the first through $n^{th}$ stages of the group respectively evaluate according to evaluation factors $b_n$ through $b_1$ which are determined such that the filtered signal corresponds to a system function $$H(z) = b_o \cdot (1 + b_1 \cdot z(1 + b_2 z( \ldots (1 + b_n \cdot z)))),$$

whereby z represents a respective delay associated with one stage of the shift register when the sampled signal values are transferred.

The advantage attainable with the invention is that the evaluation factors $b_o$ through $b_n$ on which the signal evaluators are based exhibit significantly smaller differences relative to one another than the evaluation factors $a_o$ through $a_n$ required for the realization of one and the same filter curve with a traditional transversal filter.

BRIEF DESCRIPTION OF THE DRAWINGS

FIG. 1 illustrates a first embodiment of the invention;
FIG. 2 illustrates a second embodiment of the invention;
FIG. 3 illustrates the filter circuit of FIG. 2 in integrated circuit technology;
FIG. 4 illustrates a cross-section of the arrangement according to FIG. 3 along the section line IV—IV; and
FIG. 5 illustrates voltage/time diagrams for explaining FIGS. 3 and 4.

DESCRIPTION OF THE PREFERRED EMBODIMENTS

The circuit diagram of a first embodiment of the transversal filter is illustrated in FIG. 1. It exhibits a threestage, analog shift register whose stages are referenced S1 through S3. Parallel inputs E1 through E3 which are connected to a filter input E are respectively allocated to these stages. An input signal present at E and to be filtered is periodically sampled either by means of S1 through S3 or, on the other hand, by means of a sampling stage (not illustrated) lying in series with E. The input signal is thus dissected into individual sampling values. A signal evaluator SB1 which evaluates each signal value crossing S1 with an evaluation factor $b_3$ is provided in series with S1. Signal evaluators SB2 and SB3 disposed in series with S2 and S3 evaluate all signal values traversing S2 and S3 with $b_2$ or respectively $b_1$ in a corresponding manner. The stage S3 is followed by a signal evaluator SBa evaluating with $b_o$, its output simultaneously representing the output A of the transversal filter. A further parallel input E4 is thus disposed such that sampling values of the input signal supplied over it only traverse SBa but not the other signal evaluators.

The filtered output signal appearing at A is composed of the individual sampling values of the input signal in the following manner. At a prescribed point in time, let a sampling value of the input signal supplied over E4 and evaluated $b_o$ be tappable at the output A. First added to this is the sampling value of the input signal which was earlier sampled by a specific time interval z, which was supplied over the parallel input E3, and which was transmitted over the signal evaluator SB3 and the stage S3, where it experiences a delay time z in the stage S3. Also added is the sampling value of the input signal which was sampled by twice the time interval, thus 2z, before the prescribed point in time, which was supplied over the parallel input E2, and which was evaluated with $b_2$ and $b_1$ when crossing SB2 and SB3, and was also delayed by a respective delay time z when crossing S2 and S3. Finally, another sampling value must be added which was sampled at three times the time interval, i.e. 3z, before the prescribed point in time, and which was supplied over the parallel input E1 and was transmitted over SB1 through SB3 as well as over S1 through S3, where it was evaluated with $b_3$, $b_2$ and $b_1$ and was delayed by a respective delay time z in each of the stages S1 through S3. All of these added sampling values are likewise evaluated with $b_o$ in SBa. Added sampling values are likewise evaluated with $b_o$ in SBa. When the sampling values appearing at the prescribed points in time at A are combined, then the relationship $$H(z) = b_o \cdot (1 + b_1 \cdot z(1 + b_2 \cdot z(1 + b_3 \cdot z))) \tag{2}$$

derives for the sum signal, whereby it is presumed that the function value of the input signal to be filtered does not significantly change during the three time intervals, i.e. 3z, but rather corresponds to a standardized value 1.

When the shift register S1 through S3 illustrated in FIG. 1 is analogously expanded to a shift register having a group of n stages S1 through Sn, where n signal evaluators SB1 through SBn with evaluation factors $b_n$ through $b_1$ and n parallel inputs E1 through En are allocated to the n stages, then the relationship (2) can be replaced by the more general relationship $$H(z) = b_0 \cdot (1 + b_1 \cdot z(1 + b_1 \cdot z(\ldots(1 + b_n \cdot z)))) \quad (3)$$

A mathematical comparison of relationship (3) with relationship (1) now shows that the respectively described system functions H(z) are completely identical when the evaluation factors $b_i$ (i+1 ... n) derive from the filter coefficients $a_i$ (i=1 ... n) in the following manner:

$$b_1 = a_1/a_{i-1}; \quad b_o = a_o. \quad (4)$$

That means that each transversal filter of the type initially cited can be replaced by a filter according to FIG. 1 which was expanded to n stages S1 through Sn, whereby the evaluation factors $b_i$ of the signal evaluators SB1 through SBn are respectively represented as quotients $a_i/a_{i-1}$ of two filter coefficients of the relationship (1). Although the values $a_i$ for specific filter curves can differ considerably, adjacent values $a_i$ and $a_{i-1}$ do not deviate very greatly from one another, so that values likewise deviating only relatively slightly from one another result for the evaluation factors $b_i$ of the signal evaluators SB1 through SBn employed in the inventive transversal filter. Accordingly, the signal evaluators SB1 through SBn can be realized relatively simply. Characteristic of the transversal filter according to the invention is that given employment of a shift register with a group of n stages, all n signal evaluators allocated thereto lie in a signal path proceeding from the input of the first stage over all n stages. In FIG. 1, for example, given three stages S1 through S3, the signal evaluators SB1 through SB3 allocated to these stages are disposed in one signal path which proceeds from E1 over SB1, S1, SB2, S2, SB3 and S3 up to the output of the third stage. Furthermore, the signal evaluators which are allocated to the first through $n^{th}$ stage S1 through Sn respectively evaluate according to the evaluation factors $b_n$ through $b_i$, i.e. with inverse sequence. Thus, for example, SB1 in FIG. 1 evaluates with $b_3$, SB2 with $b_2$, and SB3 with $b_1$. The circuit parts S1, SB1, E1 are combined into a first filter stage FS1, the circuit parts S2, SB2 and E2 are combined into a second filter stage FS2, and S3, SB3, and E3 are combined into FS3.

A further development of the filter according to FIG. 1 is shown in FIG. 2, and is advantageously employed when the evaluation factors $b_1$, $b_2$, $b_3$ given a design according to FIG. 1 are greater than 1 or smaller than 0. When the evaluation factor $b_3$ (FIG. 1) is greater than 1 or smaller than 0, i.e. negative, then it is standardized to a value $b_3'$ (FIG. 2) which is smaller than or equal to 1 but greater than 0. This occurs since $b_3$ is divided by a divisor $\pm D_1$. As compensation for this, a further signal evaluator SB21 must, on the one hand, be provided in series with the parallel input E2 of the second stage S2, the further signal evaluator SB21 evaluating sampling values supplied over E2 with an evaluation factor $\pm 1/D_1$ and, on the other hand, the evaluation factor $b_2$ (FIG. 1) of the second stage S2 must be multiplied by the divisor $\pm D_1$. When the evaluation factor $b_2$ thus arising is in turn greater than 1 or smaller than 0, then it is divided by a divisor $\pm D_2$ so that a standardized evaluation factor $b_2'$ again arises. As compensation for this, a further signal evaluator SB31 is inserted in series with the input E3, said further signal evaluator evaluating with $\pm 1/D_2$ so that the evaluation factor $b_1$ of the third stage S3 is multiplied by the divisor $\pm D_2$. When, as a result thereof, a value for $b_1$ which is greater than 1 or smaller than 0 is derived, then a standardization of the corresponding evaluation factor to a value $b_1'$ is likewise undertaken for the third stage S3. For this purpose, $b_1$ is divided by a divisor $\pm D_3$ to a value $b_1'$. A further signal evaluator SBa1 is provided in series with the parallel input E4, said further signal evaluator evaluating with $\pm 1/D_3$. Finally, the evaluation factor $b_o$ of SBa is multiplied by the divisor $\pm D_3$.

This standardization method for $b_3'$, $b_2'$ and $b_1'$ can, of course, also be analogously applied given expansion of the filter to n register stages S1 through Sn. What is essential is that the standardization of the evaluation factor $b_{n-(i-1)}$ of the stage $S_i$(i=1 ... n-1) leads to the fact that a further signal evaluator is provided in series with the parallel input of the stage $S_{i+1}$, said further signal evaluator evaluating with $\pm 1/D_i$. The signal evaluator of the stage $S_{i+1}$ is evaluated with a corrected evaluation factor $b_{n-(i-2)} \cdot (\pm D_i)$.

FIG. 3 shows an embodiment of the transversal filter according to FIG. 2 which is monolithically integrated on a body referenced 1 comprised of doped semiconductor material, for example p-conductive silicon. A cross-section of the semiconductor body 1 along the line IV—IV of FIG. 3 is illustrated in FIG. 4. This view illustrates that its boundary surface 1a is covered with a thin layer 2 comprised of an electrical insulating material, for example $SiO_2$. Dashed horizontal lines 3 through 7 are provided in FIG. 3 which laterally limit the layer 2 between them. Outside of these broken lines, the boundary surface 1a is covered with a thick, electrical insulating layer which, when it is formed of $SiO_2$, is referred to as the field oxide layer.

The transversal filter illustrated in FIG. 3 exhibits a shift register in the form of a charge transfer device (CTD). Associated with this device is an input stage ES which exhibits a region 8 inserted into the semiconductor body 1 and doped oppositely relative to the basic doping thereof. For example, this region is an n-conductive region 8 which extends up to the boundary surface 1a. It is provided with a terminal which is connected to a clock voltage $\phi_{ED}$. The input stage ES further comprises mutually adjacent electrodes 9 and 10 of electrically conductive material disposed on the insulating layer 2. The first of these electrodes covers the semiconductor region adjacent to the region 8. The electrode 9 is thus connected via a terminal to the voltage $U_{ref+}$. The electrode 10 is connected to the input signal $U_e$ to be filtered via the parallel input E1 connected to the filter input E.

Electrodes 11 through 23 referred to as transfer electrodes are connected in a known manner to the input stage ES. In the illustrated case of a 4-phase arrangement, four successive transfer electrodes are combined into a register stage and are wired via their terminals to one of four respective clock voltages $\phi 1$ through $\phi 4$. For reasons of clarity, let the shift electrode 11 which is wired with $\phi 4$ be interpreted as an intermediate electrode so that the following electrodes 12 through 15 belong to the first register stage S1, the electrodes 16 through 19 belong to the second register stage S2, and the electrodes 20 through 23 belong to the third stage S3.

Provided next to the electrode 23 is an output stage AS which exhibits a semiconductor region 24 inserted into the semiconductor body 1 and doped opposite to the basic doping of 1. The semiconductor region 24 is conducted over the source-drain path of a field effect transistor 25 to a terminal 26 which is connected to a reference voltage $U_R$. The gate of transistor 25 is connected to a terminal 27 which is connected with a clock voltage $\phi_R$. Also, the region 24 is connected with the gate of a field effect transistor 28 whose source-drain path lies in a current branch which is connected, on the one hand, to a terminal 29 carrying the supply voltage $V_{DD}$ and, on the other hand, to a circuit point 29a lying at reference potential. A load element 30 is inserted in the current branch between the source terminal of the field effect transistor 28 and the circuit point 29a. This load element 30 is realized as a field effect transistor of the depletion type whose gate is connected to its source terminal. The junction between the source terminal of the field effect transistor 28 and the load element 30 simultaneously represents the filter output A.

The electrodes 13 and 14 of the stage S1 are designed shorter than the electrodes 9 through 12, whereby the channel width of the CTD channel which is defined up to the electrode 12 by the mutual spacing of the lines 3 and 4 is correspondingly reduced. For this purpose the electrical insulating layer 2 on the boundary surface 1a is designed as a thick film in the area of an island 31, the thick film corresponding in thickness approximately to the insulating layer lying outside of the lines 3 through 7. The upper edge of the insulating layer island 31 in FIG. 3 thus limits the CTD channel. Further electrodes 32 and 33 are situated on the thin insulation layer 2 on an extension of the electrodes 13 and 14. At the other side of the insulation layer island 31, the first of the further electrodes is connected to the voltage $U_{ref+}$ and the latter is connected via a terminal which corresponds to the parallel input E2 to the input signal to be filtered. A further semiconductor region 34 inserted into the semiconductor body 1 and oppositely doped relative thereto, i.e. for example, n-conductive, lies between the semiconductor regions covered by the electrodes 12 and 32 but below the insulating layer island 31 in FIG. 3. This semiconductor region 34 extends up to the boundary surface 1a. It is connected via a terminal to the clock voltage $\phi_{ED}$. The region 34 preferably extends from the lower longitudinal edge of the insulating layer island 31 up to the line 5.

The width of the CTD channel determined in the area of the input stage ES and of the electrodes 11 and 12 by the lines 3 and 4 is reduced in the area of the stage S1 between the electrodes 12 and 13 to the spacing of the line 3 from the insulating layer island 31. The parts 32 through 34 represent a second CTD input stage whose channel width is provided by the spacing of the line 5 from the insulating layer island 31. This input stage discharges at the right-hand end of 31 into the CTD channel of reduced width proceeding above 31, whereby an increased channel width results in the region of the electrode 15. This channel width is determined by the mutual spacing of the lines 3 and 5.

The stages S2 and S3 are constructed analogous to S1. Thus, an insulating layer island 35 is provided in the region of S2. Further electrodes 36 and 37 are disposed therebelow as an extension of the electrodes 17 and 18, and a semiconductor region 38 doped oppositely relative to integrated body 1 is positioned between the electrodes 16 and 36. This region 38 is charged by the terminal with the clock voltage $\phi_{ED}$, electrode 36 is charged via a terminal corresponding to the parallel input E3 with the input signal to be filtered, and electrode 37 is charged via a terminal with a voltage $U_{ref-}$. The stage S3 contains an insulating layer island 39, further electrodes 40 and 41 which are disposed as an extension of the electrodes 21 and 22, and a region 42 doped oppositely relative to 1 and lying between the electrodes 20 and 40. This region 42 is connected with $\phi_{ED}$, the electrode 40 is connected with $U_{ref+}$, and the electrode 41 is connected to the input signal to be filtered. It is connected thereto over its terminal which corresponds to the parallel input E4. The components 36 through 38 thus form a third input stage and the components 40 through 42 form a fourth input stage of the shift register.

The input stages are known per se in terms of structure and, for example, from U.S. Pat. Nos. 4,163,957 and 4,231,002, both incorporated herein by reference. In detail, the input stages ES, 32 through 34 and 40 through 42 positively evaluate the input signal to be filtered. This is achieved in that a constant voltage $U_{ref+}$ is supplied to the electrodes 9, 32, and 40. This voltage must not be greater than the lowest voltage value of the input signal. The input stage 36 through 38 negatively evaluates the input signal to be filtered, whereby a constant voltage $U_{ref-}$ is supplied to the electrode 37. This voltage must not be smaller than the highest voltage value of the input signal. One thus proceeds on the basis that the momentary value of the input signal to be filtered lies between the lowest and highest voltage value at every point in time or coincides with one of these points in time. The above division of the various input stages in terms of positive and negative evaluation properties is randomly assumed and can be correspondingly modified as needed.

At time point t1 (FIG. 5) during operation, the semiconductor region at the boundary surface 1a below the electrodes 9, 10 and correspondingly below 32, 33, below 36, 37, and below 40, 41 is flooded with charge carriers from the adjacent regions 8, 34, 38 and 42 due to the disconnection of $\phi_{ED}$. After time point t2, only those potential wells formed below the electrodes 10, 33, 37 and 41 remain filled with charge carriers, whereby the excess charge carriers flow back into these regions. The charge carrier packets formed in the potential wells depend on the value of the input signal present at time point t2. Thus, the charge carrier packets formed below 10, 33, and 41 are proportional to the momentary value of the input signal (positive evaluation), whereas the charge carrier packet formed below 37 is inversely proportional to the momentary value of the input signal (negative evaluation). At time point t3, i.e. given application of the clock voltage $\phi_4$, the charge carrier packets are shifted under the electrodes 11, 15, 19, and 23. At time point t5, i.e. given application of the clock voltage $\phi_4$ within the next clock period, the charge carrier packet situated under 11 has partially shifted under the electrode 15, and at time point t6, is added there to the charge carrier packet newly formed under 33. Likewise, the charge carrier packets newly formed in the other input stages are respectively added to the charge carrier packets previously sampled by the input stages transferred one register stage toward the left and shifted over a register stage. These addition events repeat upon the respective appearance of the individual clock pulses of $\phi_4$.

Every charge carrier packet which is transferred under the electrode 12 is divided in accordance with the paths x1 and x2 illustrated in FIG. 3. Since the portion passing onto x2 does not continue forward in the CTD arrangement, but rather is diverted over the region 34 because of the clock $\phi_{ED}$ appearing at time point t2, this amounts to a reduction of the charge carrier packet input at ES by the factor $x1/(x1+x2)$. When this factor coincides with b3' (FIG. 3), then the function of the signal evaluator SB1 is realized. On the other hand, an evaluation of each charge carrier packet input over the input stage 32 through 34 can ensue since the width of the corresponding CTD channel, i.e. the spacing of the line 5 from the insulating layer island 31, is correspondingly selected. When this width corresponds to the spacing of the lines 3 and 4, then the evaluation factor 1 is present. When, in contrast thereto, the spacing between 5 and 31 is smaller than the spacing between 3 and 4 by a specific factor, then the charge carrier packet input over the input stage 32 through 34 is smaller by this factor than the packet input over ES. When the reduction factor is selected as $\pm 1/D_1$, then the function of the further signal evaluator SB21 is fully realized by the components 32 through 34. In an analogous manner, the signal evaluators SB2 and SB3 are realized by the circuit components 16, 35, 38 or 20, 39, 42, and the further signal evaluators SB31 and SBa1 are realized by the components 36 through 38 or 40 through 42. The combination of the parallel inputs E2 through E4 with the preceding stages S1 through S3 provided according to FIG. 3 can be shown in FIG. 2 by the connections 43 through 45 indicated with broken lines.

Before the actual clock pulses $\phi 4$, the field effect transistor 25 is turned on by a pulse $\phi_R$, so that the region 24 is reset to a fixed reference voltage $U_R$. The filtered output signal then arises at the output A by means of the periodic transfer of the summed charge carrier packets into the region 24, whereby the signal evaluator SBa can be eliminated in the realization of the inventive transversal filter because it now only signifies an amplification or attenuation of the output signal which could also be undertaken outside of the filter. The latter also applies to the filter circuits according to FIGS. 1 and 2.

Although various minor changes and modifications might be proposed by those skilled in the art, it will be understood that we wish to include within the claims of the patent warranted hereon all such changes and modifications as reasonably come within our contribution to the art.

We claim as our invention:

1. A transversal filter, comprising:
an analog shift register having a plurality of parallel inputs and a serial output;
a signal input which supplies an input signal to all parallel inputs so that the input signal forms successively sampled signal values;
a serial output where a filtered output signal is available;
n signal evaluator means and n parallel inputs being respectively allocated to a group of n stages of the shift register;
the signal evaluator means in each stage being positioned in a signal path between the respective parallel input and the respective stage, and preceding stages connecting to succeeding stages through an intervening signal evaluator means;
the signal evaluator means of the first through $n^{th}$ stages of said group respectively evaluating according to evaluation factors $b_n$ through $b_1$ which are determined such that the filtered signal corresponds to a system function $$H(z) = b_o \cdot (1 + b_1 \cdot z(1 + b_2 \cdot z(\ldots(1 = b_n \cdot z))))$$

where z represents a respective delay associated with one stage of the shift register when the sampled signal values are transferred, and $b_o$ represents an evaluation factor of a signal evaluator means between the serial output and a last stage of the shift register.

2. A transversal filter according to claim 1 wherein the signal evaluator means of each $i^{th}$ stage (i=1. . . n−1) whose evaluation factor $b_{n-(i-1)}$ exhibits a value greater than 1 or less than 0 evaluates according to a standardized evaluation factor, that is an evaluation factor $b_{n'-(i-1)}$ divided by a divisor $\pm D_i$, said standardization evaluation factor being less than or equal to 1 but greater than 0, wherein a further signal evaluator means is provided at the parallel input of the stage i+1, said further signal evaluator means executing an evaluation with $\pm 1/D_i$, and wherein the signal evaluator means of the stage i+1 evaluates according to a corrected evaluation factor $b_{n-(i-2)} \cdot (\pm D_i)$.

3. A transversal filter according to claim 1 wherein the analog shift register is designed as a charge transfer device (CTD) on a doped semiconductor body of first conductivity type; the signal evaluator means comprise branches of a channel of the charge transfer device, and wherein the channel branches comprise a semiconductor region of second conductivity type next to a transfer electrode lying at the boundary surface of the semiconductor body and being connected with a clock pulse voltage; the parallel inputs being formed by CTD input stages which are allocated to the stages of the charge transfer device; and the CTD input stages being allocated to a second and further stages, and have respective channels which discharge into the channel of the charge transfer device.

4. A transversal filter according to claim 3 wherein the semiconductor region of a channel branch simultaneously belongs to the CTD input stage allocated to the same stage of the charge transfer device.

5. A transversal filter according to claim 3 wherein a width of a channel branch is dimensioned relative to a channel width of the CTD channel present in front of the branch such that a reduction of the channel width which arises corresponds to the evaluation factor of the signal evaluator means.

6. A transversal filter according to claim 3 wherein a width of the channel of the CTD input stage allocated to a second or a further stage of the charge transfer device is reduced in comparison to the CTD input stage allocated to the first stage of the charge transfer device, and is reduced by a factor which corresponds to the evaluation factor of one of the further signal evaluator means.

7. A transversal filter, comprising:
an analog shift register having n stages;
parallel inputs associated with each stage and a signal input which supplies an input signal to the parallel inputs so that the input signal forms successively sampled signal values at each of the parallel inputs;
a serial output where a filtered output signal is available;
n signal evaluator means with each signal evaluator means being connected between a respective parallel input and analog shift register stage, the output of the first stage connecting to an input of the signal evaluator means of the second stage, the output of the second stage connecting to an input of the signal evaluator means of the third stage;
a signal evaluator means connected between the serial output and the output of the third stage, and with a parallel input being provided between this signal evaluator means and the output of the third stage; and the signal evaluator means of the first through $n^{th}$ stages of said group respectively evaluating according to evaluation factors $b_n$ through $b_1$ which are determined such that the filtered signal corresponds to a system function $$H(z) = b_0 \cdot (1 + b_1 \cdot z(1 + b_2 z( \ldots (1 + b_n \cdot z)))),$$

whereby z represents a respective delay associated with one stage of the shift register when the sampled signal values are transferred, and $b_0$ is the evaluation factor of the signal evaluator means connecting at the serial output.

* * * * *